US007016016B2

(12) United States Patent
Munnig Schmidt et al.

(10) Patent No.: US 7,016,016 B2
(45) Date of Patent: Mar. 21, 2006

(54) LITHOGRAPHIC APPARATUS AND DEVICE MANUFACTURING METHOD

(75) Inventors: Robert-Han Munnig Schmidt, Hapert (NL); Pieter Willem Herman De Jager, Rotterdam (NL); Theodorus Leonardus Van Den Akker, Valkenswaard (NL)

(73) Assignee: ASML Netherlands BV, Veldhoven (NL)

( * ) Notice: Subject to any disclaimer, the term of this patent is extended or adjusted under 35 U.S.C. 154(b) by 41 days.

(21) Appl. No.: 10/875,530

(22) Filed: Jun. 25, 2004

(65) Prior Publication Data

US 2005/0286039 A1   Dec. 29, 2005

(51) Int. Cl.
  *G03B 27/42* (2006.01)
  *G03B 27/52* (2006.01)
  *G03B 27/58* (2006.01)
(52) U.S. Cl. .............................. 355/53; 355/55; 355/72
(58) Field of Classification Search .................. 355/52, 355/53, 55, 67–77; 250/548; 356/399–401; 430/311
  See application file for complete search history.

(56) References Cited

U.S. PATENT DOCUMENTS

| 5,229,872 | A |   | 7/1993  | Mumola |
| 5,296,891 | A |   | 3/1994  | Vogt et al. |
| 5,500,736 | A |   | 3/1996  | Koitabashi et al. |
| 5,523,193 | A |   | 6/1996  | Nelson |
| 5,530,482 | A |   | 6/1996  | Gove et al. |
| 5,579,147 | A |   | 11/1996 | Mori et al. |
| 5,640,243 | A | * | 6/1997  | Koitabashi et al. ......... 356/401 |
| 5,677,703 | A |   | 10/1997 | Bhuva et al. |
| 5,691,541 | A | * | 11/1997 | Ceglio et al. ............ 250/492.1 |
| 5,808,797 | A |   | 9/1998  | Bloom et al. |
| 5,982,553 | A |   | 11/1999 | Bloom et al. |
| 6,060,224 | A | * | 5/2000  | Sweatt et al. ............... 430/395 |
| 6,133,986 | A |   | 10/2000 | Johnson |
| 6,151,120 | A | * | 11/2000 | Matsumoto et al. ........ 356/399 |
| 6,177,980 | B1 |  | 1/2001  | Johnson |
| 6,687,041 | B1 |  | 2/2004  | Sandstrom |
| 6,747,783 | B1 |  | 6/2004  | Sandstrom |
| 6,795,169 | B1 |  | 9/2004  | Tanaka et al. |

(Continued)

FOREIGN PATENT DOCUMENTS

EP   1 482 375 A2   12/2004

(Continued)

Primary Examiner—Henry Hung Nguyen
(74) Attorney, Agent, or Firm—Sterne, Kessler, Goldstein & Fox P.L.L.C.

(57) ABSTRACT

A lithographic apparatus patterns a projection beam of radiation using a patterning system. A substrate is supported on a substrate table and the patterned beam is projected onto the substrate on the table. A substrate displacement control system displaces the substrate relative to the table and the projection system in a predetermined direction, such that the patterned beam is scanned across the substrate. The position of the substrate relative to the table and the patterned beam is determined by the displacement control system. The displacement control system comprises at least one component that is displaceable with the substrate and a positioning apparatus to place that component in contact with the substrate, such that the component is displaced with the substrate as the projection beam is scanned across the substrate and such that the component is lifted from the substrate after the projection beams has been scanned across the substrate. The component could be, for example, an elongate strip carrying alignment marks or a magnet which is used to apply a displacement force to the substrate.

34 Claims, 3 Drawing Sheets

U.S. PATENT DOCUMENTS

| | | |
|---|---|---|
| 6,806,897 B1 | 10/2004 | Kataoka et al. |
| 6,811,953 B1 | 11/2004 | Hatada et al. |
| 2004/0041104 A1 | 3/2004 | Liebregts et al. |
| 2004/0130561 A1 | 7/2004 | Jain |

FOREIGN PATENT DOCUMENTS

| | | |
|---|---|---|
| WO | WO 98/33096 | 7/1998 |
| WO | WO 98/38597 | 9/1998 |

* cited by examiner

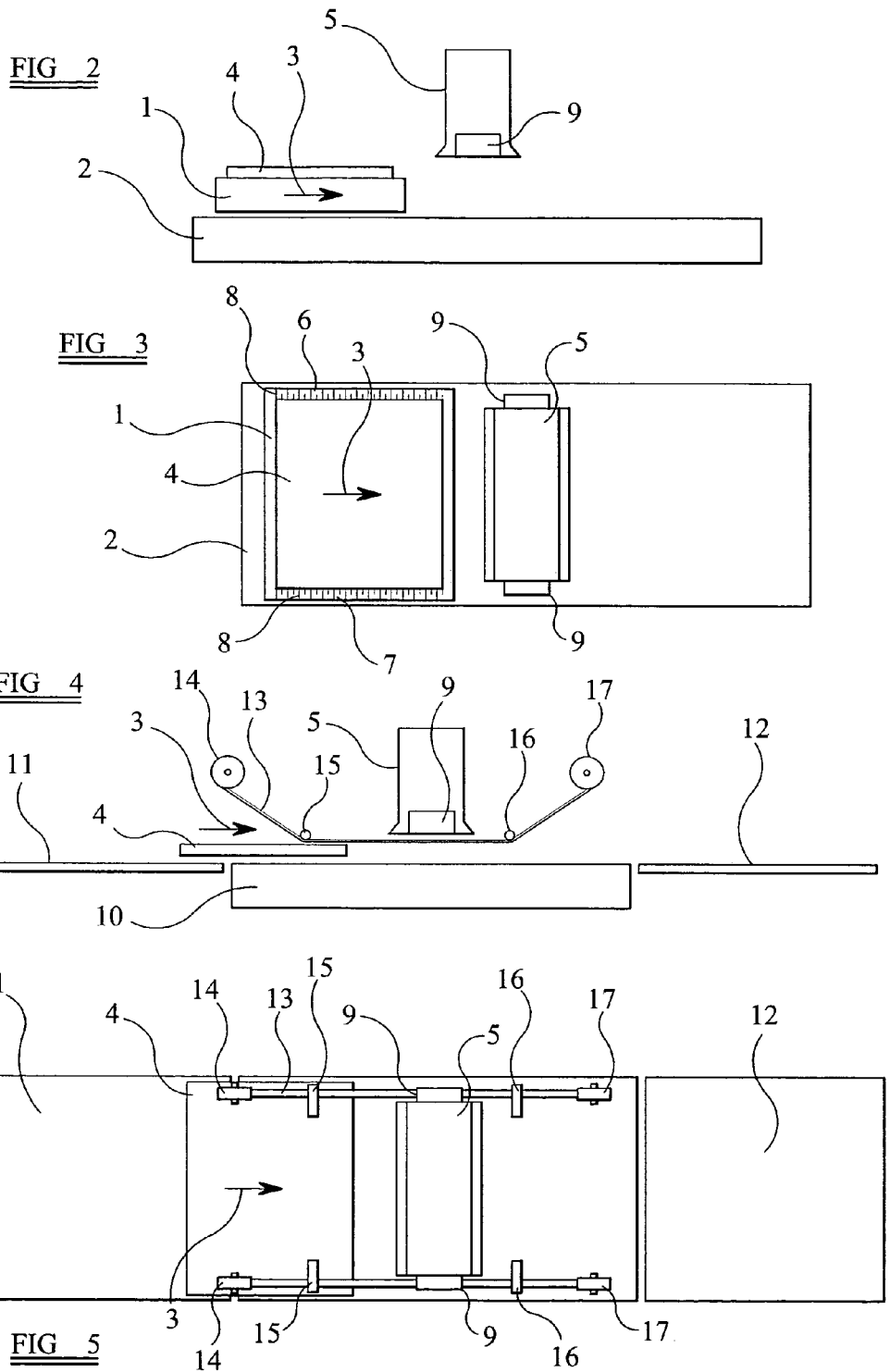

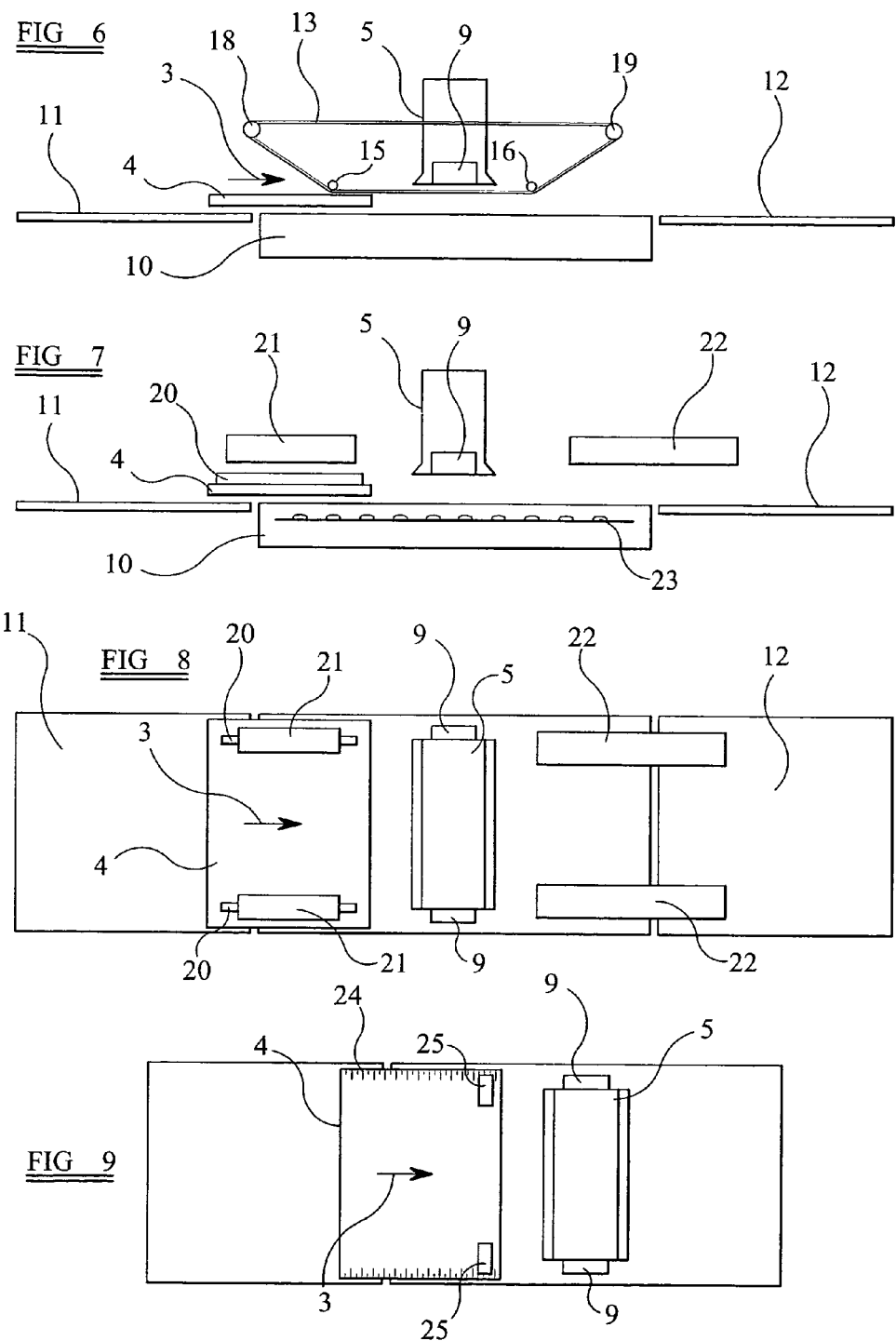

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means may comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the projection beam in a given direction (the "scanning" direction), while synchronously scanning the substrate parallel or anti-parallel to this direction.

Large flat panel displays (FPD's) are being designed which require the exposure of very large thin glass substrates. For example, glass substrates with a thickness of less than 1 mm and edge dimensions typically of 1.85×2.2 meters. On each glass substrate, several panels (e.g. 4, 6, or 9) may be defined, with each panel corresponding to a single product such as a computer monitor screen or a TV screen. With such large substrates, it has been proposed to mount the substrate on a displaceable table and to then displace the table using, for example, linear motors. The table is thus functionally equivalent to a chuck, and must be moved with precision to ensure that the substrate supported on the chuck is in the appropriate position relative to a projection beam. With such an arrangement, a combined mass of the moving components (e.g., the substrate and the chuck) is larger than the mass of the substrate itself. This results in high inertial forces, which are generally undesirable in apparatus requiring high positional precision.

It has also been proposed, in the context of exposing large substrates for FPD's, to rely upon a stationary optical column (e.g., components that generate the projection beam) and a substrate displacement system that moves the substrate along a simple linear path beneath optical column, such that the projection beam is scanned across the substrate. Thus, a width of the projection beam must be equal to a width of a target portion of the substrate. This can be achieved by appropriate design of optical column, but it is nonetheless necessary to very accurately control the position of the substrate along its direction of displacement relative to optical column.

It is known to support substrates, such as large glass panels, on, for example, a pressurized air bearing, such that the panel is readily displaceable on that bearing relative to an upper surface of a static support table. Such a "floating" substrate support system could then rely upon any appropriate arrangement to achieve displacement of the substrate. This could be, for example, by applying a mechanical force directly to an edge of the substrate, by directing jets of air against the substrate such that a net force results in the desired direction of displacement, or by applying force using a magnetic arrangement coupled to the substrate. Unfortunately, in the context of lithographic apparatus, where positional accuracy is fundamental, it is very difficult to use such a displacement system itself to indicate substrate position. For example, where a lithographic apparatus is provided with a displaceable chuck, alignment marks (often referred to as "encoder gratings") can be provided on the chuck itself. From those alignment marks, and a predefined known relative position, as between the chuck and the substrate, the position of the substrate can be accurately determined. Where the substrate is "floating" relative to the underlying table, however, the position of the substrate itself can only be determined by reference to alignment marks or other physical characteristics of the substrate itself. Such alignment marks must be provided on the substrate before the substrate is presented to the lithographic apparatus, and therefore an extra processing step, and possibly an additional lithographic apparatus, must be provided simply for the provision of alignment marks on the substrate.

A further problem with controlling the position of a large area thin substrate on a floating bearing is that of accurately controlling the force applied to the substrate, so as to achieve uniform and predictable displacement of the substrate. The simple application of a mechanical force to one edge of the substrate is problematic given its thickness relative to its area, displacement relying upon air pressure is difficult to control, and there is nothing on the substrate to enable its magnetic coupling to an appropriate magnetic drive.

Therefore, what is needed is a lithographic system and method that allow for accurate positional measurement and/or movement of a large work piece during patterning of the work piece.

SUMMARY OF THE INVENTION

According to an embodiment of the present invention, there is provided a lithographic apparatus comprising an illumination system for supplying a projection beam of radiation, a patterning system serving to impart to the projection beam a pattern in its cross-section, a substrate table for supporting a substrate, a projection system for projecting the patterned beam onto the substrate, and a substrate displacement control system to displace the substrate relative to the table and the projection system in a predetermined direction, such that the projection beam is scanned across the substrate and to determine the position of the substrate relative to the table and the projection beam. The displacement control system comprises at least one component that is displaceable with the substrate and a positioning apparatus to place the at least one component in contact with the substrate, such that the at least one component is displaced with the substrate as the projection beam is scanned across the substrate and to lift the at least one component from the substrate after the projection beam has been scanned across the substrate.

According to an another embodiment of the present invention, there is provided a device manufacturing method comprising the steps of providing a substrate, providing a projection beam of radiation using an illumination system, imparting to the projection beam a pattern in its cross section, projecting the patterned beam onto a target portion of the substrate using a projection system, and displacing the substrate relative to the table and the projection system in a predetermined direction using a displacement system, such that the projection beam is scanned across the substrate and the position of the substrate relative to the table and the projection system is determined. At least one component of the displacement system is displaced with the substrate. The at least one component is placed in contact with the substrate so as to be displaced with the substrate as the projection beam is scanned across the substrate and being lifted from the substrate after the projection beam has been scanned across the substrate.

In one example, to determine with accuracy the position of substrate, the component that is placed on the substrate may be in the form of an elongate strip on which alignment marks are formed. The positioning apparatus lays the strip on the substrate, or a pair of strips along opposite edges of the substrate, such that the or each strip extends parallel to the desired direction of displacement. A detector is provided to detect the alignment marks formed on the or each strip to determine the position of the substrate.

In one example, the strip may be dispensed from a supply reel and taken up by a take up reel. Alternatively, in another example, the strip could be continuous and extend around a closed loop path. In another example, a force could be applied to the strip to cause displacement of the substrate. For example, this can be done by simply pulling on the strip or by rendering the strip magnetic and applying an appropriate displacement force using for example an electromagnet.

In one example, a simple magnet could be deposited on the substrate and used to deliver a displacement force by exposing it to an appropriate magnetic field. Substrate table may define a static upper surface above which the substrate is supported on an air bearing. The component mounted on the substrate may be adapted to adhere to the substrate electrostatically or as a result of a high friction material being formed on a surface of the component which bears against the substrate.

Further embodiments, features, and advantages of the present inventions, as well as the structure and operation of the various embodiments of the present invention, are described in detail below with reference to the accompanying drawings.

BRIEF DESCRIPTION OF THE
DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 2 is a side view of an apparatus for exposing a substrate for use in a flat panel display.

FIG. 3 is a view from above of the apparatus shown in FIG. 2.

FIG. 4 is a side view of an apparatus for exposing a substrate for use in a flat panel display, according to one embodiment of the present invention.

FIG. 5 is a view from above of the apparatus of FIG. 4.

FIG. 6 is a side view of an apparatus for exposing a substrate for use in a flat panel display, according to one embodiment of the present invention.

FIG. 7 is a side view of an apparatus for exposing a substrate for use in a flat panel display, according to one embodiment of the present invention.

FIG. 8 is a view from above of the apparatus of FIG. 7.

FIG. 9 is a view from above of an apparatus for exposing a substrate, according to one embodiment of the present invention.

The present invention will now be described with reference to the accompanying drawings. In the drawings, like reference numbers may indicate identical or functionally similar elements.

Figure 1:
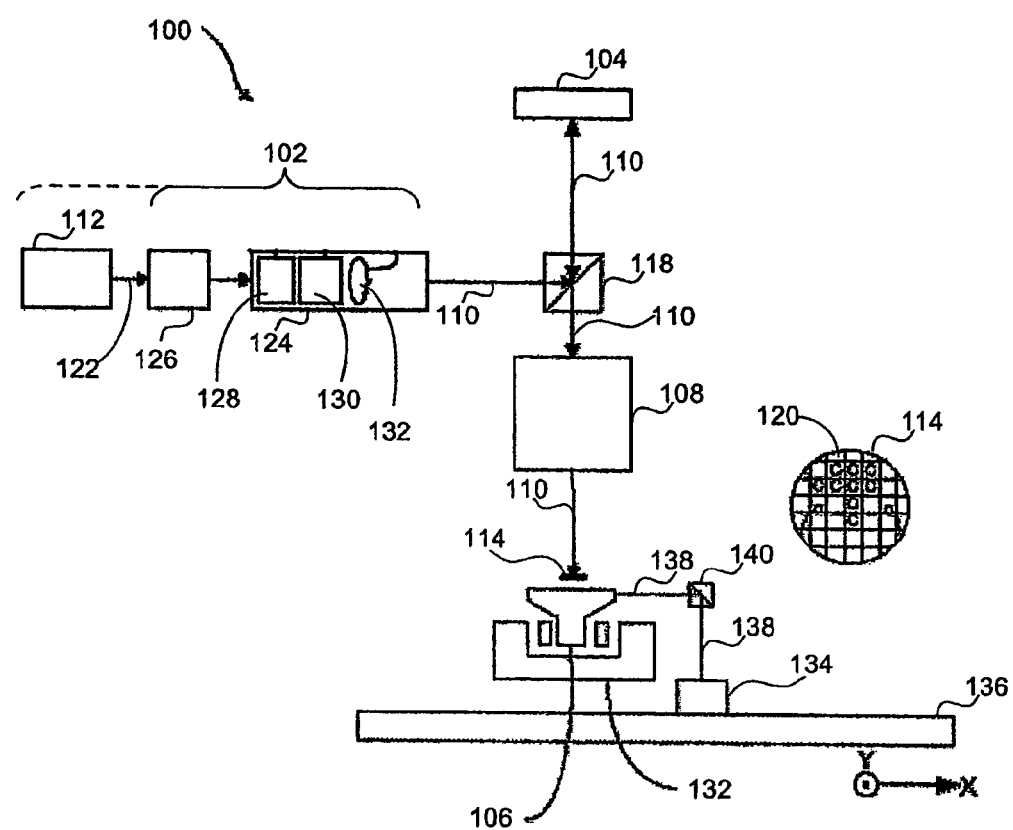
FIG. 1 depicts a lithographic apparatus, according to one embodiment of the invention.

DETAILED DESCRIPTION OF THE
EMBODIMENTS

Overview and Terminology

Although specific reference may be made in this text to the use of lithographic apparatus in the manufacture of integrated circuits (ICs), it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (e.g., a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array may comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

Lithographic Projection Apparatus

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a projection beam 110 of radiation (e.g., UV radiation), which in this particular case also comprises a radiation source 112.

An array of individually controllable elements 104 (e.g., a programmable mirror array) can be used for applying a pattern to projection beam 110. In general, the position of the array of individually controllable elements 104 can be fixed relative to projection system 108. However, in an alternative arrangement, an array of individually controllable elements 104 may be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or CaF2 lens system or a catadioptric system comprising lens elements made from such materials, or a mirror system) can be used for projecting the patterned beam received from a beam splitter 118 onto a target portion 120 (e.g., one or more dies) of substrate 114. Projection system 108 may project an image of the array of individually controllable elements 104 onto substrate 114. Alternatively, projection system 108 may project images of secondary sources for which the elements of the array of individually controllable elements 104 act as shutters. Projection system 108 may also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander 126, for example. Illuminator 124 may comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, projection beam 110 impinging on the array of individually controllable elements 104 has a desired uniformity and intensity distribution in its cross section.

It should be noted, with regard to FIG. 1, that source 112 may be within the housing of lithographic projection apparatus 100 (as is often the case when source 112 is a mercury lamp, for example). In alternative embodiments, source 112 may also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directing using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 106 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system may also be used to position the array of individually controllable elements 104. It will be appreciated that projection beam 110 may alternatively/additionally be moveable, while object table 106 and/or the array of individually controllable elements 104 may have a fixed position to provide the required relative movement.

In an alternative configuration of the embodiment, substrate table 106 may be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 may be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 may be used to project a patterned projection beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned projection beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned projection beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned projection beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned projection beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned projection beam 110 scans across substrate 114 and exposes it.

Combinations and/or variations on the above described modes of use or entirely different modes of use may also be employed.

In the embodiment shown in FIG. 1, array of individually controllable elements 104 is a programmable mirror array. Programmable mirror array 104, comprises a matrix arrangement of tiny mirrors, each of which can be individually tilted about an axis. The degree of tilt defines the state of each mirror. The mirrors are controllable, when the element is not defective, by appropriate control signals from the controller. Each non-defective element is controllable to adopt any one of a series of states, so as to adjust the intensity of its corresponding pixel in the projected radiation pattern.

In one example, the series of states includes: (a) a black state in which radiation reflected by the mirror makes a minimum, or even a zero contribution to the intensity distribution of its corresponding pixel; (b) a whitest state in which the reflected radiation makes a maximum contribution; and (c) a plurality of states in between in which the reflected radiation makes intermediate contributions. The states are divided into a normal set, used for normal beam patterning/printing, and a compensation set, used for compensating for the effects of defective elements. The normal set comprises the black state and a first group of the intermediate states. This first group will be described as grey states, and they are selectable to provide progressively increasing contributions to corresponding pixel intensity from the minimum black value up to a certain normal maximum. The compensation set comprises the remaining, second group of intermediate states together with the whitest state. This second group of intermediate states will be described as white states, and they are selectable to provide contributions greater than the normal maximum, progressively increasing up to the true maximum corresponding to the whitest state. Although the second group of intermediate states are being described as white states, it will be appreciated that this is simply to facilitate the distinction between the normal and compensatory exposure steps. The entire plurality of states could alternatively be described as a sequence of grey states, between black and white, selectable to enable grey-scale printing.

Exemplary Apparatus for Exposing a Substrate

FIG. 2 is a side view of an apparatus for exposing a substrate for use in a flat panel display and FIG. 3 is a view from above of the apparatus shown in FIG. 2. For example, in this and other embodiments described below, the substrate can be, but is not limited to, a large glass substrate. In these figures, a substrate table 1 is displaceable upon a static support 2 in a direction of arrow 3. A substrate 4 is fixed in a predetermined location on table 1, so as to be advanced with table 1 beneath an optical column 5. As shown in FIG. 3, edges 6 and 7 of substrate table 1 have formed upon them a series of alignment marks 8 positioned so that they will pass beneath detectors 9 arranged on either side of optical column 5. The position of substrate 4 relative to optical column 5 is determined by detectors 9 by detection of the alignment marks 8.

Optical column 5 projects a patterned beam across the full width of substrate 4, so that in a single pass of the substrate beneath optical column 5 the whole active surface of substrate 4 may be exposed. The position at any instant of substrate 4 relative to optical column 5 is determined by reference to the position of substrate table 1 relative to optical column 5 as determined by detection of alignment marks 8 defined on substrate table 1.

A total mass of the displaceable components, i.e., substrate table 1 and substrate 4, is greater than a mass of substrate 4 alone. An inertia is thus relatively high. Thus, it would be desirable if substrate 4 could be transported on a "floating" bearing, for example an air bearing. Unfortunately, in such an arrangement it would not be possible to rely upon alignment marks on substrate table 1, as substrate table 1 would be static relative to optical column 5. The only way the position of substrate 4 can be accurately determined in such circumstances is to provide alignment marks on substrate 4 itself. Unfortunately, starting with a simple glass panel, there are no alignment marks, and therefore given the floating nature of the bearing upon which substrate 4 would be supported, there is no accurate reference system for accurately determining the substrate position.

Second Exemplary Apparatus for Exposing a Substrate

FIG. 4 is a side view of an apparatus for exposing a substrate for use in a flat panel display, according to one embodiment of the present invention and FIG. 5 is a view from above of the apparatus of FIG. 4. FIGS. 4 and 5 illustrate an arrangement that allows for accurate identification of the position of substrate 4. Where appropriate, the same reference numerals are used in FIGS. 4 and 5 as in FIGS. 2 and 3.

Referring to FIG. 4, a static substrate table 10 is disposed beneath optical column 5 provided with alignment mark detectors 9 on each of its sides. Substrate 4 is supported on a floating bearing, so as to be readily displaceable on static substrate table 10. Further support tables 11 and 12 are provided on either side of static substrate table 10. For example, static substrate table 10 could be, but is not limited to, a marble slab with a polished upper surface defining channels through which air may be pumped or from which air may be evacuated, so as to accurately control a pressure between an upper surface of static substrate table 10 and an under surface of substrate 4. Substrate 4 can then be stably supported at a predetermined height above static substrate table 10 and readily transported by the application of relatively small forces.

In one example, in order to enable the position of substrate 4 relative to optical column 5 to be determined, alignment strips 13 are dispensed from supply reels 14, passed around guide rollers 15 and 16, and taken up by take up reels 17. In one example, surfaces of alignment strips 13 facing upwards towards optical column 5 carry alignment marks. For example, alignment marks can be, but are not limited to, patterns of lines that can be readily detected by detectors 9. The opposite sides of alignment strips 13 are provided with an appropriate surface, such that relative slippage as between the upper surface of substrate 4 and alignment strips 13 is avoided. For example, alignment strips 13 may be fabricated from a material, such that they adhere electrostatically to substrate 4.

In one example, alignment strips 13 are fabricated from a material of high stiffness, such that spacing between the alignment marks on the upper surfaces of alignment strips 13 are predictable. Given that alignment strips 13 are effectively adhered to the upper surface of substrate 4 during movement of substrate 4 beneath optical column 5, optical column 5 can be used to expose a resist deposited on the upper surface of substrate 4 so as to "print" a definitive set of alignment marks on substrate 4. That definitive set of alignment marks can then be used in further processing steps. Thus, the use of alignment strips 13 makes it possible to form an appropriate set of alignment marks on substrate 4 using the same lithographic apparatus as that used in subsequent processing steps of substrate 4.

In one example, substrate 4 starts in the position illustrated in FIG. 5, is then transported fully beneath optical column 5, and is then further transported in the same direction to a subsequent stage of the apparatus. In this example, alignment strips 13 are gradually transferred from reels 14 to reels 17.

In one example, substrate 4 starts in the position shown in FIG. 5, is then advanced fully beneath optical column 5 until it lies beneath reels 17, and is then returned to the position shown in FIG. 5 before removal to a subsequent processing stage. In this example, alignment strips 13 will be transported back and forth between reels 14 and 17. Therefore, it may not be necessary to periodically rewind alignment strips 13 from take up reels 17 to supply reels 14.

Third Exemplary Apparatus for Exposing a Substrate

FIG. 6 is a side view of an apparatus for exposing a substrate for use in a flat panel display, according to one embodiment of the present invention. FIG. 6 shows an alternative embodiment of the invention similar to that illustrate in FIGS. 4 and 5, but in which alignment strips 13 define closed loops, reels 14 and 17 of FIGS. 4 and 5 being replaced by simple rollers 18 and 19. In this embodiment, it is not necessary to rewind alignment strips 13. This is true even when substrate 4 is moved from the position shown in FIG. 6 to the right of optical column 5, and further to the right to a subsequent processing apparatus.

Exemplary Displacement Controlling

In the embodiments of the invention illustrated in FIGS. 4 to 6, no mention is made of the manner in which a force is imparted to substrate 4 so as to cause it to be displaced above static substrate table 10. FIGS. 7 and 8 illustrate one approach to controlling the displacement of substrate 4.

FIG. 7 is a side view of an apparatus for exposing a substrate for use in a flat panel display, according to one embodiment of the present invention and FIG. 8 is a view from above of the apparatus of FIG. 7.

Referring to FIGS. 7 and 8, a substrate 4 is again advanced in the direction of arrow 3 beneath an optical column 5. In this example, alignment strips 20 are shown positioned so as to extend along the side edges of substrate 4, alignment strips 20 are positioned by appropriate positioning devices, which are represented by rectangles 21. Strip removal devices 22 are also provided on the opposite side of optical column 5. In one example, alignment strips 20 are magnetic, and positioning devices 21 and 22 may also be magnetic so as to enable alignment strips 20 to be placed on substrate 4 as shown in FIGS. 7 and 8, and subsequently removed from substrate 4 after substrate 4 has been displaced beneath optical column 5.

In order to cause a displacement of substrate 4, static substrate table 10 has embedded within it an electromagnet represented by wire 23 in FIG. 7. Together strip magnets 20 and electromagnet 23 form a linear motor, which can be used to accurately control the displacement of substrate 4.

Alignment strips 20 may be used solely for the purposes of controlling the displacement of substrate 4, but in addition, in one example, could have formed on their upper surfaces alignment marks that can be detected by detectors 9, so as to monitor the position of substrate 4 relative to optical column 5. Thus, in this example, the alignment marks on alignment strips 20 would be functionally equivalent to the alignment marks on alignment strips 13 in the embodiments of FIGS. 4 to 6. In one example, alignment strips 20 also provide a means for controlling the displacement, as well as assessing the position of substrate 4.

In one example, alignment strips 20 are placed on substrate 4 on one side of optical column 5 using positioning devices 21 and are lifted from substrate 4 on the opposite side of optical column 5 by positioning devices 22. In this example, it is desirable to return alignment strips 20 to their starting position.

In one example, substrate 4 could initially assume the position shown in FIGS. 7 and 8, then be transported beneath optical column 5, and then returned to the position shown in FIGS. 7 and 8, so that alignment strips 20 could be removed by positioning devices 21, which were used to place alignment strips 20 on substrate 4. In this example, positioning devices 22 would not be required.

Fourth Exemplary Apparatus for Exposing a Substrate

FIG. 9 is a view from above an apparatus for exposing a substrate for use in a flat panel display, according to one embodiment of the present invention In this embodiment, a substrate 4 already has formed upon it a series of alignment marks 24. Substrate 4 is intended to be displaced in the direction of arrow 3 beneath an optical column 5, alignment marks 24 being detected by detectors 9. In this example, it is necessary already to have formed alignment marks 24, for example by using alignment strips 13 or 20 as shown in FIGS. 4 to 7. In this example where alignment marks 24 are already provided, it is still necessary to control the movement of substrate 4. This can be achieved using simple magnets 25 that can be positioned in any appropriate location on substrate 4, an electromagnet (not shown) embedded in static substrate table 10 being used to apply a force to magnets 25, and through those magnets to apply that same force to substrate 4.

As an alternative to relying upon magnetic forces to cause displacement of substrate 4, in embodiments such as illustrated in FIGS. 4 to 6 where strips are applied to substrate 4, those strips could be used to pull substrate 4 over table 10 by for example driving take-up reels 17 to apply a tension to alignment strips.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic apparatus, comprising:
an illumination system that supplies a projection beam of radiation;
an array of individually controllable elements that patterns the projection beam;
a projection system that projects the patterned beam onto a target portion of a substrate on a substrate table; and
a substrate displacement control system that (1) displaces the substrate relative to the substrate table and the projection system in a predetermined direction, such that the patterned beam is scanned across the substrate and (2) determines the position of the substrate relative to the substrate table and the projection beam, the displacement control system comprising:
at least one component that is displaceable with the substrate, and
a positioning apparatus to place the at least one component in contact with the substrate, such that (1) the at least one component is displaced with the substrate as the patterned beam is scanned across the substrate and (2) the at least one component is removed from the substrate after the patterned beam has been scanned across the substrate.

2. The apparatus of claim 1, further comprising:
a detector,
wherein the at least one component comprises at least one elongate strip on which alignment marks are formed,
wherein the positioning apparatus comprises a device that lays the at least one elongate strip on the substrate, such that the strip extends parallel to the predetermined direction, and
wherein the detector detects the alignment marks formed on the at least one elongated strip to determine the position of the substrate relative to the substrate table and the patterned beam.

3. The apparatus of claim 2, wherein:
the at least one elongate strip comprises two elongate strips having alignment marks formed on each; and
the positioning apparatus comprises devices that position alignment strips along opposite edges of the substrate.

4. The apparatus of claim 2, further comprising:
first and second reels, wherein each one of the at least one elongate strip extends between the first and second reels, such that during displacement of the substrate the first reel supplies the at least one elongated strip and the second reel takes up the at least one elongated strip.

5. The apparatus of claim 2, wherein each one of the at least one elongate strip is a continuous strip, which is supported so that during displacement of the substrate the continuous strip travels along a closed loop path.

6. The apparatus of claim 2, further comprising:
a device that applies a force to the at least one elongate strip to cause displacement of the substrate relative to the substrate table and the patterned beam.

7. The apparatus of claim 6, wherein the at least one elongate strip is magnetic, and wherein the displacement control system further comprises:
a device that generates a magnetic field, such that a force is applied to the at least one elongate strip to cause displacement of the substrate relative to the substrate table.

8. The apparatus of claim 6, wherein the displacement control system further comprises:
a device for pulling the at least one elongate strip, such that a force is applied to the substrate by the at least one elongate strip to cause displacement of the substrate relative to the substrate table.

9. The apparatus of claim 1, wherein:
the at least one component comprises at least one magnet;
the positioning apparatus comprises a device that (1) places the at least one magnet on the substrate before displacement of the substrate and (2) lifts the at least one magnet from the substrate after displacement of the substrate; and
the displacement control system further comprises a device that generates a magnetic field, such that a force is applied to the at least one magnet to cause displacement of the substrate relative to the substrate table.

10. The apparatus of claim 9, wherein:
the at least one magnet comprises two magnets; and
the positioning apparatus comprising a device that places the two magnets on opposite sides of the substrate.

11. The apparatus of claim 9, wherein the device that generates the magnetic field comprises at least one electromagnet.

12. The apparatus of claim 11, wherein the at least one electromagnet is supported in the substrate table.

13. The apparatus of claim 1, wherein the substrate table defines a static upper surface above which the substrate is supported on a bearing.

14. The apparatus of claim 13, wherein the bearing is an air bearing.

15. The apparatus of claim 1, wherein the at least one component comprises:
a support surface that bears against the substrate, the support surface resisting slippage relative to the substrate.

16. The apparatus of claim 15, wherein the support surface adheres electrostatically to a support.

17. The apparatus of claim 15, wherein the support surface is formed of a layer of resilient high friction material.

18. A device manufacturing method, comprising:
(a) patterning a projection beam of radiation with an array of individually controllable elements;
(b) projecting the patterned projection beam onto a target portion of a substrate on a table;
(c) displacing the substrate relative to the table and the projection system in a predetermined direction using a displacement system, such that the patterned projection beam is scanned across the substrate and the position of the substrate relative to the table and the projection system is determined; and
(d) displacing at least one component of the displacement system with the substrate, the at least one component being placed in contact with the substrate so as to be displaced with the substrate as the patterned projection beam is scanned across the substrate and being removed from the substrate after the patterned projection beam has been scanned across the substrate.

19. The method of claim 18, wherein step (d) comprises:
using an elongate strip on which alignment marks are formed as the at least one component, wherein the elongate strip is placed on the substrate so as to extend parallel to the predetermined direction.

20. The method of claim 19, further comprising:
placing two elongate strips on which alignment marks are formed along opposite edges of the substrate.

21. The method of claim 19, further comprising:
supplying the at least one elongate strip from a supply reel; and
taking up the at least one elongate strip from a take up reel.

22. The method of claim 19, further comprising:
using a continuous strip as the elongate strip that travels along a closed loop path during displacement of the substrate.

23. The method of claim 19, further comprising:
applying a force to the elongate strip to cause displacement of the substrate relative to the table and the patterned projection beam.

24. The method of claim 23, further comprising:
using a magnetic elongate strip as the elongate strip; and
generating a magnetic field to apply the force to displace the substrate.

25. The method of claim 23, further comprising:
pulling the strip to apply the force to displace the substrate.

26. The method of claim 18, wherein step (d) comprises:
using a magnet as the at least one component;
placing the magnet on the substrate; and
generating a magnetic field to apply a force to the magnet to cause displacement of the substrate relative to the table.

27. The method of claim 26, further comprising:
placing two of the magnets on opposite sides of the substrate.

28. The method of claim 26, further comprising:
generating the magnetic field by energizing at least one electromagnet.

29. The method of claim 28, further comprising:
supporting the at least one electromagnet in the table.

30. The method of claim 18, further comprising:
supporting the substrate on a bearing above a static upper surface of the table.

31. The method of claim 30, further comprising:
using an air bearing to support the substrate.

32. The method of claim 18, wherein step (d) comprises:
providing the at least one component with a support surface that bears against the substrate, such that the support surface is resistant to slippage relative to the substrate.

33. The method of claim 32, further comprising:
securing the support surface electrostatically to the substrate.

34. The method of claim 32, wherein the support surface is defined by a resilient, high friction material to secure to the substrate.

* * * * *